(12) United States Patent
Zhou et al.

(10) Patent No.: US 12,707,997 B2
(45) Date of Patent: Aug. 11, 2026

(54) POWER MODULES AND RELATED METHODS

(71) Applicant: SEMICONDUCTOR COMPONENTS INDUSTRIES, LLC, Phoenix, AZ (US)

(72) Inventors: Jinchang Zhou, Scottsdale, AZ (US); Asif Jakwani, Scottsdale, AZ (US); Chee Hiong Chew, Seremban (MY); Yusheng Lin, Phoenix, AZ (US); Sravan Vanaparthy, Scottsdale, AZ (US); Silnore Tejero Sabando, Lapulapu City (PH)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 65 days.

(21) Appl. No.: 17/804,423

(22) Filed: May 27, 2022

(65) Prior Publication Data

US 2022/0293499 A1 Sep. 15, 2022

Related U.S. Application Data

(62) Division of application No. 16/556,541, filed on Aug. 30, 2019, now Pat. No. 11,373,939.

(60) Provisional application No. 62/736,521, filed on Sep. 26, 2018.

(51) Int. Cl.
*H10W 70/40* (2026.01)
*H10W 70/04* (2026.01)
*H10W 74/10* (2026.01)

(52) U.S. Cl.
CPC ......... *H10W 70/481* (2026.01); *H10W 70/04* (2026.01); *H10W 70/424* (2026.01); *H10W 74/114* (2026.01)

(58) Field of Classification Search
None
See application file for complete search history.

(56) References Cited

U.S. PATENT DOCUMENTS

2010/0133667 A1 6/2010 Oka et al.
2013/0249071 A1 9/2013 Yao et al.
2015/0179552 A1* 6/2015 Myung .................. H01L 23/13 257/773
2019/0067154 A1* 2/2019 Yoshihara .............. H01L 25/18

* cited by examiner

*Primary Examiner* — Daniel Whalen
(74) *Attorney, Agent, or Firm* — IPTechLaw

(57) ABSTRACT

Implementations of power modules may include: a substrate having a first side and a second side. The power module may include a plurality of leads coupled to a second side of the substrate and a molding compound over a portion of five or more surfaces of the substrate. The power module may also include an opening extending from a first side of the substrate to an outer edge of the molding compound. The opening may be configured to receive a coupling device and the coupling device may be configured to couple with a heat sink or a package support.

20 Claims, 7 Drawing Sheets

POWER MODULES AND RELATED METHODS

CROSS REFERENCE TO RELATED APPLICATIONS

This application is a divisional application of the earlier U.S. Utility Patent Application to Zhou et al. entitled "Power Modules and Related Methods," application Ser. No. 16/556,541, filed Aug. 30, 2019, now pending, which application claims the benefit of the filing date of U.S. Provisional Patent Application 62/736,521, entitled "Quad Leadframe Packages and Related Methods" to Zhou et al. which was filed on Sep. 26, 2018, the disclosures of each of which are hereby incorporated entirely herein by reference.

BACKGROUND

1. Technical Field

Aspects of this document relate generally to power modules, such as switches, bridges, and inverters. More specific implementations involve metal oxide semiconductor field effect transistors (MOSFETs) and insulated-gate bipolar transistor (IGBTs).

2. Background

Power integrated modules process power according to the information content at a control interface. Functions covered by power modules include power supply bus types, passive components integrated into the bus and the passive components integrated into the load, among others. An integrated power module provides the physical containment package for several power components, usually power semiconductor devices.

SUMMARY

Implementations of power modules may include: a substrate having a first side and a second side. The power module may include a plurality of leads coupled to a second side of the substrate and a molding compound over a portion of five or more surfaces of the substrate. The power module may also include an opening extending from a first side of the substrate to an outer edge of the molding compound. The opening may be configured to receive a coupling device and the coupling device may be configured to couple with a heat sink or a package support.

Implementations of power modules may include one, all, or any of the following:

Power modules may also include stand-off units positioned around the opening on the outer edge of the molding compound. The stand-off units may be configured to support the package against the heat sink or the package support.

The package of claim 1, further comprising a second opening, wherein the first opening and the second opening are evenly spaced within the package.

The plurality of leads may include a 3.81 mm pitch.

The plurality of leads may each be an equal distance from two or more leads on a side of a lead frame comprising the plurality of leads.

The power module may also include one or more die mechanically and electrically coupled to the second side of the substrate.

Implementations of power modules may be formed using a method of forming a power module, the method may include: coupling a lead frame to a substrate. The lead frame may have a plurality of leads extending from the frame on each of four sides of the lead frame. The method may include selectively trimming a first set of the plurality of leads. The method may also include forming an encapsulant around at least five surfaces of the substrate and a portion of each of a second set of the plurality of leads. The method may include trimming the lead frame including trimming one or more of the plurality of leads to a predetermined length.

Implementations of methods of forming power modules may include one, all, or any of the following:

The method may also include using a fixture to prevent a flow of encapsulant into one or more mounting holes in the substrate.

The lead frame may be coupled to the substrate through one of soldering or sintering.

Forming the encapsulant may include using a transfer molding method.

The first set of the plurality of leads may not extend into the encapsulant and may be completely removed with the lead frame during trimming of the lead frame.

The substrate may further include a mounting hole extending from a first side to a second side of the substrate.

The substrate may include one of a direct bonded copper substrate (DBC) with a ceramic core, a direct bonded aluminum (DBA) substrate, an active metal brazing (AMB) substrate, an insulated metal substrate (IMS), a plated ceramic substrate, a high-layer-count (HLC) printed wiring board (PWB), a low temperature co-fired ceramic (LTCC) substrate, a high temperature co-fired ceramic (HTCC) substrate, or a polymer coated conductive plate.

Implementations of power modules may be formed using a method of forming a power module, the method may include: providing a substrate having a first side, a second side, and one or more mounting holes extending from the first side to the second side. The method may include coupling a lead frame having a plurality of leads to the substrate. The method may include selectively trimming a first set of the plurality of leads. The method may include encapsulating at least five surfaces and a portion of each of a second set of the plurality of leads in molding compound. The method may include trimming the lead frame from the plurality of leads.

Implementations of methods of forming power modules may include one, all, or any of the following:

The substrate may include two mounting holes extending from the first side to the second side of the substrate.

The first set of the plurality of leads may not extend into a cavity included in the transfer molding method.

Forming the encapsulant may include using a transfer molding method.

The encapsulant may include one of epoxies, resins, polymers or any combination thereof.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended power modules will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such power modules, and implementing components and methods, consistent with the intended operation and methods.

In various power module designs, package size is generally desired to be as small as possible. At least some of the power modules and packages disclosed in this document may be referred to quad leadframe packages (QLP).

Figure 1:
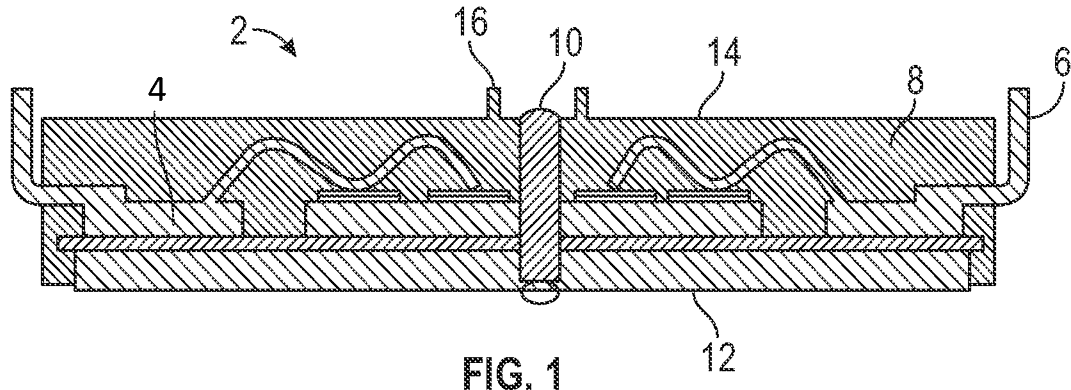
FIG. 1 is a cross sectional view of an implementation of a power module.
Figure 2:
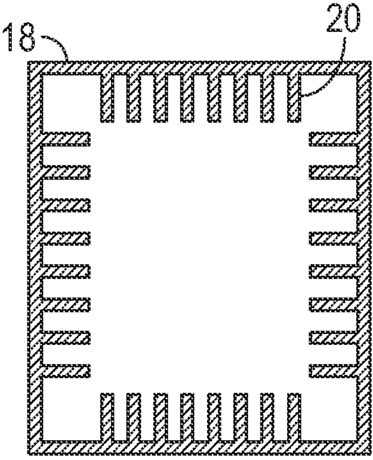
FIG. 2 is a top view of an implementation of a lead frame.

Referring to FIG. 1, a side view of an implementation of a power module 2 is illustrated. The power module includes a substrate 4 coupled with leads 6 and encapsulated with a molding compound 8. In the particular implementation illustrated, the substrate 4 is a direct bonded copper substrate (DBC) with a ceramic core. The substrate may be electrically isolated with portions exposed for thermal conducting. In various implementations, the substrate may be, by non-limiting example, a direct bonded aluminum (DBA) substrate, an active metal brazing (AMB) substrate, an insulated metal substrate (IMS), a plated ceramic substrate, a high-layer-count (HLC) printed wiring board (PWB), a low temperature co-fired ceramic (LTCC) substrate, a high temperature co-fired ceramic (HTCC) substrate, a polymer coated conductive plate, or any other substrate type with desired reliability, heat dissipation, and/or partial discharge characteristics. In various implementations, the ceramic may include an alumina ($Al_2O_3$) ceramic doped with zirconium dioxide ($ZrO_2$), a silicon nitride ($Si_3N_4$) ceramic, an aluminum nitride (AlN) ceramic, a high strength AlN (H—AlN) ceramic, or any combination thereof.

The module 2 also includes a mounting hole 10 running from a first side 12 of the module to a second side 14 of the module. The mounting hole 10 may be used to mount heat sinks to the module and/or to mount the module to a support (circuit board, motherboard, etc.). As illustrated, stand-offs 16 are located around a perimeter of the mounting hole 10. The stand-offs may support the weight of a heat sink and protect the module from being deflected/bent under the force of the screw or other coupling device holding the module to the support or heat sink. In various implementations, a package may include a first mounting hole and a second mounting hole. In other implementations, the package may include more than two mounting holes. As illustrated, in this implementation, one or more die are coupled to a first side of the substrate. Wire bonds are also illustrated which mechanically and electrically couple the one or more die to other portions of the substrate and other devices in the module. The structure of this module may have high reliability and extremely low thermal resistance. The module may also having a high amperage capacity in the range of about 75 A to about 150 A.

Various implementations of power modules may include a silicon carbide free wheeling diode (FWD). A FWD may be include within a power integrated module (PIM) or converter inverter brake (CIB). A CIB has three function modules including a converter, an inverter, and a brake. The converter may include a rectifier with four to six diodes. The inverter may include six IGBTs and six FWD. The brake may be integrated together with the FWD.

Referring to FIGS. 2-6, various power module implementations are illustrated following various process steps in an implementation of a method of forming a power module. As will be described, the assembly process for such a power module may be simplified and may produce a compact and a more lightweight package. The method includes providing a lead frame 18. As illustrated here, the lead frame 18 is fully populated having a plurality of leads 20 with a pitch of about 3.8 mm. The plurality of leads are located on four sides of the frame and face inward toward the center of the lead frame. Each set of the plurality of leads 20 on the lead frame includes leads that are equidistant relative to each other (except right at the corner areas, where the leads are offset to accommodate the corner).

Figure 3:
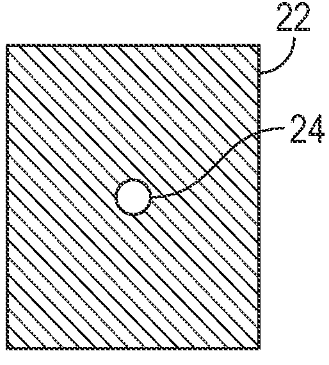
FIG. 3 is a top view of an implementation of a substrate.
Figure 4:
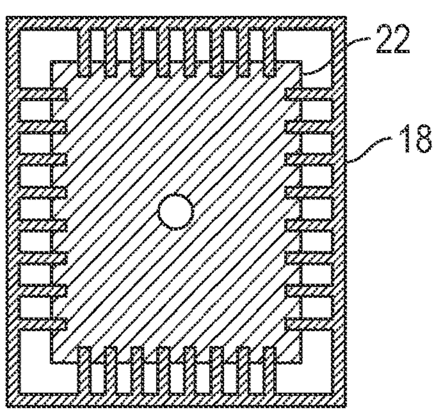
FIG. 4 is a top view of an implementation of a lead frame coupled to a second side of an implementation of a substrate.
Figure 15:
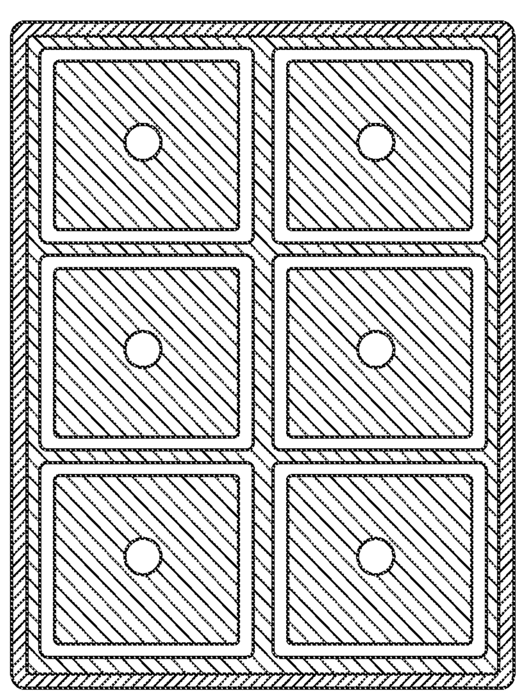
FIG. 15 is a top view of an implementation of a panel of substrates.

Referring to FIG. 3, the method includes providing a substrate 22. In various implementations, the substrate may include a DBC substrate. The substrate may be singulated from a panel of substrates 23 as illustrated in FIG. 15 (sometimes referred to as a mastercard of substrates). In various implementations, the method may include forming a hole 24 through the substrate where the hole will form a portion of the mounting hole illustrated in FIG. 1. In other implementations, the substrate may be preassembled with a hole therethrough. The hole may be formed through, by non-limiting example, drilling, laser drilling, punching, or any other method of forming an opening. Referring to FIG. 4, the method includes coupling the lead frame 18 and the substrate 22 together. The lead frame is coupled to a second side of the substrate. In various implementations, the substrate may be coupled with the first or the second side of the substrate. In some methods, the leads may be coupled to the substrate through, by non-limiting example, adhesive, soldering, ultrasonic welding, or other methods for coupling metal components.

Figure 5:
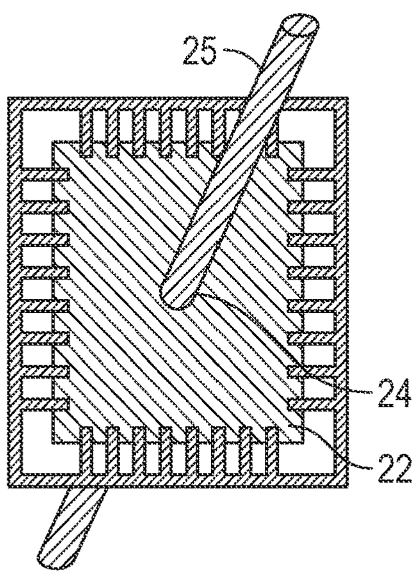
FIG. 5 is a top view of an implementation of a cylinder inserted through a mounting hole of an implementation of a substrate.

The method also includes inserting a cylinder/rod through the mounting hole in the substrate. Referring to FIG. 5, a cylinder 25 is illustrated positioned through the mounting hole 24 of the substrate 22. The cylinder is used for the exemplary purposes of this disclosure and, by non-limiting example, various tools, molds (multi-piece or single piece), jigs, or fixtures may be used in various implementations designed to prevent flow of encapsulant into the mounting hole. The cylinder/tool prevents molding compound from filling or covering the mounting hole during the molding process. In various implementations, the cylinder/tool may be formed of a durable metal including steel. In other implementations, the cylinder/tool may be formed of plastic, resin, or another material able to withstand high temperature and pressure. The material of the cylinder/tool may also be a material that will not react with the molding compound/encapsulant or other components of the semiconductor and materials used in the formation of the semiconductor material. In other implementations, other tools or fixtures may be configured to prevent the flow of molding compound into the mounting hole during encapsulation. In some implementations, the substrate may include more than one mounting hole and a tool/fixture may be configured to prevent flow of encapsulant into all the mounting holes during encapsulation.

Figure 6:
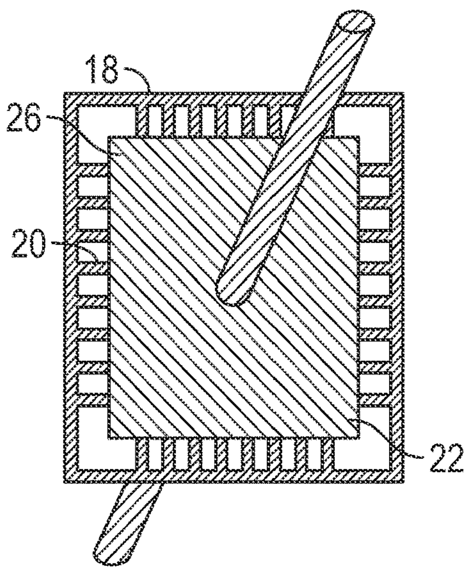
FIG. 6 is a top view of an implementation of a cylinder inserted through a mounting hole of an implementation of a substrate, the substrate encapsulated with molding compound.
Figure 7:
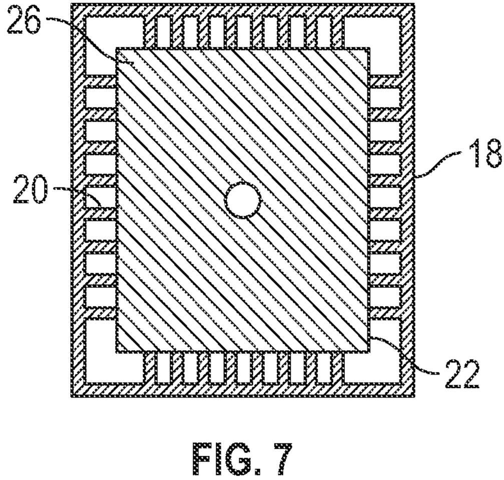
FIG. 7 is a top view of an implementation of a substrate and a lead frame encapsulated with molding compound.

The method also includes forming a molding compound 26 over the substrate 22 and over a portion of the leads 20 extending from the lead frame 18. The molding compound is also formed around the cylinder in the mounting hole. Referring to FIG. 6, the substrate 22 and lead frame are illustrated after encapsulation with the molding compound 24. The molding compound may be formed using a transfer molding technique. Transfer molding is a manufacturing process where a molding material such as, by non-limiting example, resin or epoxies, are forced into a mold or cavity. The molding material is measured and placed into a molding pot. Pressure forces the material to transfer into the mold/cavity as the material is heated. In various implementations of the method of forming a power module, the molding cavity may include a cylinder positioned in the hole in the substrate to form the mounting hole illustrated in FIG. 1, which acts to prevent entry of the mold compound into the area of the mounting hole. In some implementations, the molding compound used may include, by non-limiting example, epoxies, resins, polymers, and other materials capable of withstanding high temperatures and electronic stresses. In some implementations of a method of forming a semiconductor package, the cylinder may be removed after encapsulation with the molding compound. Referring to FIG. 7, the substrate is illustrated after removal of the cylinder. In some implementations, the cylinder is not removed until after the lead frame has been trimmed from the leads.

Figure 8:
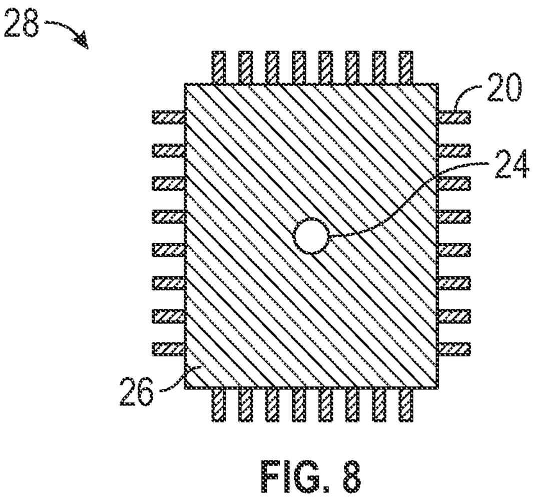
FIG. 8 is a top view of an implementation of a substrate coupled with an implementation of a plurality of leads.

The method of forming the power module includes trimming/singulating the lead frame from the plurality of leads 20. The resulting package with the exposed leads may be a high voltage power module including but not limited to switches (MOSFET, IGBT) with antiparallel diodes, half bridges (inverter leg with two switches and their corresponding diodes), three-phase inverter, (six switches and the corresponding diodes), or any other power devices/modules described herein. Referring to FIG. 8, a formed power module 28 is illustrated. The power module 28 includes a substrate having a first side and a second side. The substrate may include, by non-limiting example, a direct bonded copper substrate (DBC) with a ceramic core, a direct bonded aluminum (DBA) substrate, an active metal brazing (AMB) substrate, an insulated metal substrate (IMS), a plated ceramic substrate, a high-layer-count (HLC) printed wiring board (PWB), a low temperature co-fired ceramic (LTCC) substrate, a high temperature co-fired ceramic (HTCC) substrate, a polymer coated conductive plate, or any other substrate type with desired reliability, heat dissipation, and/or partial discharge characteristics. As previously described, the ceramic within the substrate may include an alumina ($Al_2O_3$) ceramic doped with zirconium dioxide ($ZrO_2$), a silicon nitride ($Si_3N_4$) ceramic, an aluminum nitride (AlN) ceramic, a high strength AlN (H—AlN) ceramic, or any combination thereof.

Still referring to FIG. 8, the substrate is encapsulated in a molding compound 26. In various implementations, the molding compound may include epoxies, resins, polymers, and other materials capable of withstanding high temperatures and electronic stresses. The power module 28 also includes an opening 24 extending from a first side of the substrate to an outer edge of the molding compound. The opening may be configured to receive a coupling device and the coupling device may be configured to couple with one of a heat sink or a package support. In various implementations, the opening may be preformed in the substrate. In other implementations, the method may include forming an opening in the substrate through drilling/forming using any of the methods disclosed herein. The plurality of leads may include a pitch of about 3.81 mm. As illustrated, the plurality of leads are each an equal distance from the two leads on either side of each of the leads.

In various implementations, a die may be mechanically and electrically coupled to a second side of the substrate. In various implementations, the power module may be used in high power applications such as by non-limiting example, commercial applications, industrial applications, automotive applications, and other applications requiring reduced package size and adequate clearance distance.

Figure 9:
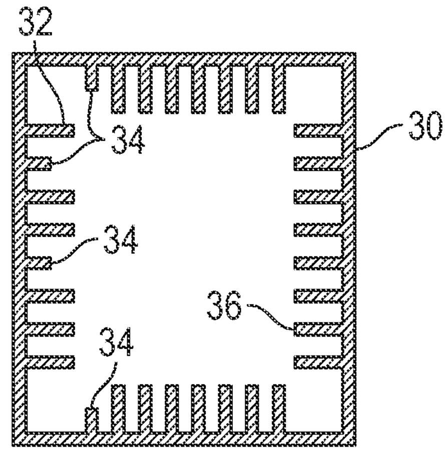
FIG. 9 is a top view of another implementation of a lead frame with selectively trimmed leads.

Referring to FIG. 9-13, power modules are illustrated following various processing steps used in another implementation of a method of forming a power module. The method includes providing a lead frame. Referring to FIG. 9, a lead frame 30 is illustrated. The lead frame 30 includes a plurality of leads 32 on four sides of the frame. The plurality of leads on each side of the lead frame are equidistant from each other (except in the corner regions to accommodate the shape of the corners). In various implementations, the leads have a pitch of about 3.81 mm, though many other pitch values may be utilized in various implementations.

The method includes selectively trimming one or more leads of the lead frame to a predetermined length (a first set of leads). The trimmed leads 34 extend a distance from the frame that is less than a distance of the untrimmed leads 36. The trimmed leads 34 may be referred to as selectively removed. This process of selective trimming may take place at the time the leadframe is originally formed (i.e., the lead frame is formed with the shortened leads at the time of manufacture). In some method implementations, the process of selective trimming may take place after the lead frame has been originally formed where one or more of the already formed leads are trimmed to a desired length. In various implementations, the leads may be trimmed by cutting.

Figure 10:
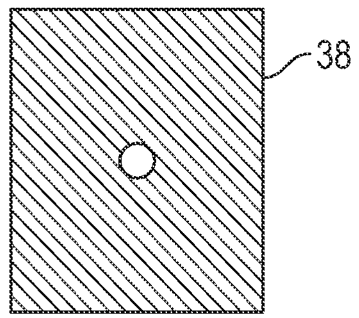
FIG. 10 is a top view of another implementation of a substrate.

Referring to FIG. 10, the method further includes providing a substrate 38. In various implementations, the substrate 38 may be any substrate type disclosed herein such as, by non-limiting example, a direct bonded aluminum (DBA) substrate, an active metal brazing (AMB) substrate, an insulated metal substrate (IMS). As illustrated, the substrate 38 includes a hole extending from a first side of the substrate to a second side of the substrate. In various implementations of a method, the substrate 38 may be provided with a prefabricated hole. In other implementations, the method may include cutting/drilling a hole through the substrate using any of the methods disclosed herein.

Figure 11:
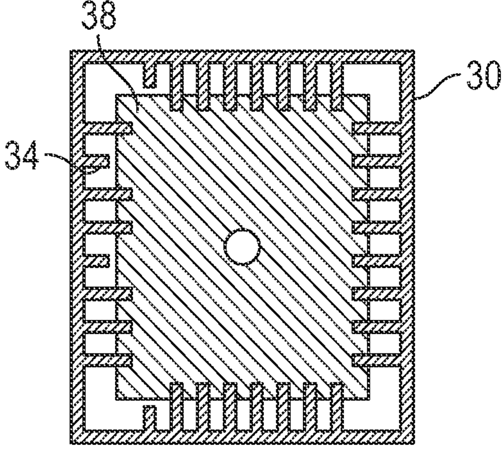
FIG. 11 is a top view of an implementation of a lead frame coupled to an implementation of a substrate.

The method includes coupling the lead frame to the substrate. Referring to FIG. 11, the lead frame 30 coupled to the substrate 38 through solder is illustrated. In other implementations, coupling the lead frame 30 to the substrate may include adhesive or other materials to securely couple a lead frame to the substrate. In still other implementations, the lead frame may be coupled to the substrate through ultrasonic welding or other methods for coupling metal components. As illustrated, the shortened leads 34 are not soldered to the substrate (because in part that they are too short to reach/touch the substrate).

Figure 12:
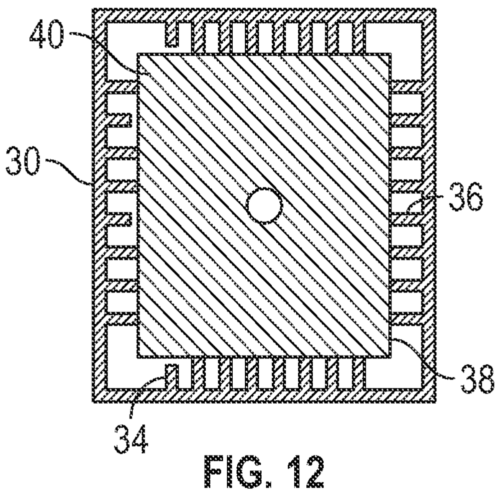
FIG. 12 is a top view of an implementation of a substrate and an implementation of a lead frame encapsulated with molding compound.

The method also includes forming a molding compound around five or more sides of the substrate. Referring to FIG. 12, a molding compound 40 is formed on the substrate 38 and around a portion of the plurality of leads 32 extending from the lead frame 30. The shortened leads 34 do not extend into the molding compound 40. In various implementations, the molding compound is formed around the substrate and leads using a transfer molding technique. In some implementations, the cavity design used in the transfer molding technique for lead frames having shortened leads may be the same cavity design for the method including a fully populated lead frame. Using the same cavity design may increase the flexibility of the design so that no molding compound flows from the cavity when using a method for selectively removed leads. Using the same cavity design for both implementations of a method for forming a power module may decrease costs in the manufacturing of power modules as described herein. In various implementations, the molding compound or encapsulants may include epoxies, resins, polymers, any combination thereof, or any other material used to protecting semiconductor components.

In some implementations, a cylinder may be inserted into the mounting hole before encapsulation of the substrate and lead frame with the molding compound. In various implementations, the cylinder may be left in the mounting hole to form support for the mounting hole as illustrated in FIG. 1. In other implementations, the cylinder may be removed after encapsulation or after lead trimming. In still other implementations, the cylinder may be replaced with a different cylinder or material that will remain in the semiconductor package. In some implementations, the cylinder may be formed of a metal or may be formed of a non-electrically active/non-chemically reactive material like any disclosed herein.

Figure 13:
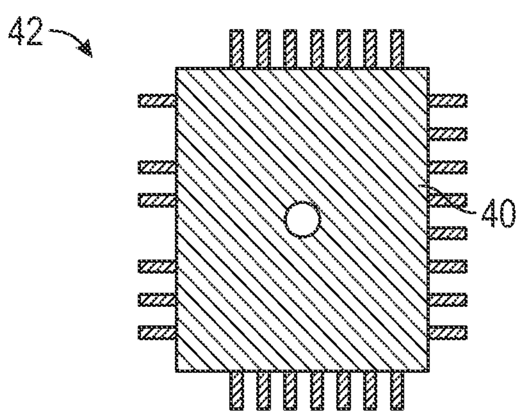
FIG. 13 is a top view of an implementation of a substrate coupled with an implementation of a plurality of leads.

The method further includes trimming the lead frame from the power module. Referring to FIG. 13, the power module 42 is illustrated after the lead frame has been trimmed through cutting through those leads that are not shortened through selective trimming or forming previously (second set of leads). In various implementations, the lead frame may be trimmed by cutting the tie bars between the frame and the leads that are encapsulated within the molding material. Trimming the lead frame also includes removing the shortened leads from surrounding the power module. The power module 42 formed through this implementation may be described as having selectively removed leads.

As illustrated, the power module 42 includes a molding compound 40 formed around a substrate. The substrate includes a first side and a second side. The substrate is coupled to a plurality of leads through solder, adhesive, ultrasonic welding, sintering, any combination thereof, or other methods for coupling metal components. In various implementations, the substrate may include a direct bonded copper substrate (DBC) with a ceramic core, a direct bonded aluminum (DBA) substrate, an active metal brazing (AMB) substrate, an insulated metal substrate (IMS), a plated ceramic substrate, a high-layer-count (HLC) printed wiring board (PWB), a low temperature co-fired ceramic (LTCC) substrate, a high temperature co-fired ceramic (HTCC) substrate, a polymer coated conductive plate, or any other substrate described herein.

Figure 14:
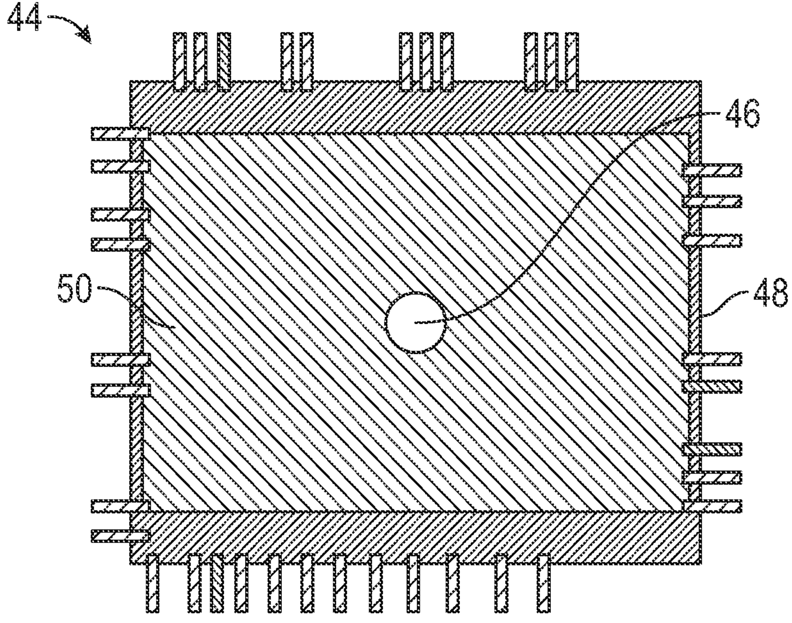
FIG. 14 is a top view of an implementation of a power module.

Referring to FIG. 14, a top view of another implementation of a power module 44 having selectively removed leads is illustrated. In this view, the screw hole or mounting hole 46 is illustrated in the center of the substrate. In other implementations, the mounting hole may be in another position in the substrate. The molding compound is illustrated surrounding the substrate 50. The molding compound 48 may cover five sides of the substrate 50. As illustrated above, in various illustrations the molding compound covers a first side of the power module encapsulating the substrate, die, wire bonds and leads. In some implementations, the molding compound may include epoxy, resin, or other materials that can withstand high temperatures and high voltage.

Figure 16:
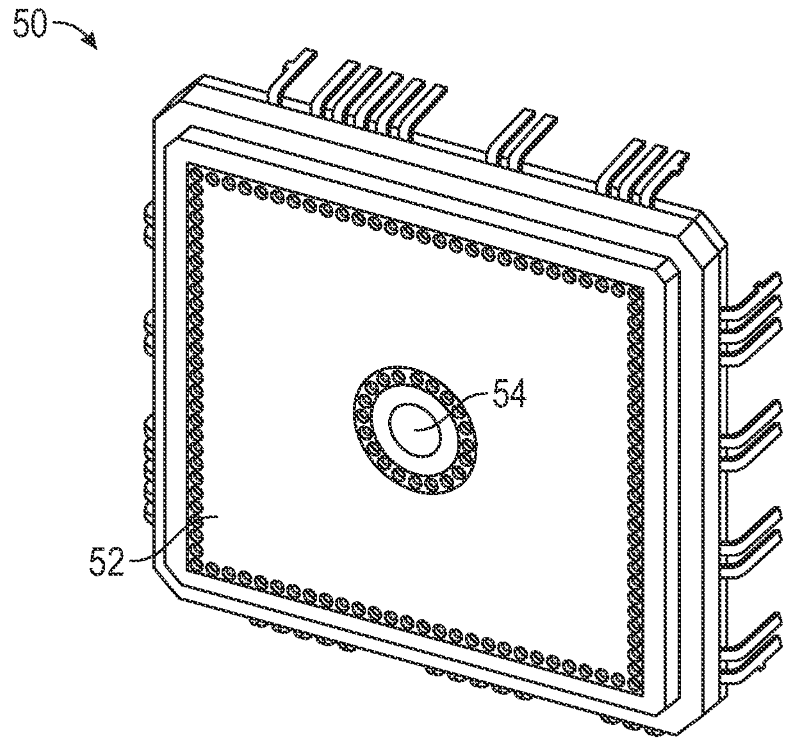
FIG. 16 is a perspective view of a first side of an implementation of a power module having a first mounting hole.

Referring to FIG. 16, a first side 52 of an implementation of a power module 50 is illustrated. The package 50 includes a single mounting hole 54. The step width of the package is 3.2 mm. In various implementations, the step width may be larger or smaller such as a 1.5 mm step width. The step width of 3.2 mm is designed to accommodate a plastic case used in installation of the power module. In various implementations, a stabilizing structure such as a plastic case with a knob or projection (not illustrated) may be necessary to prevent rotation of the package around the first mounting hole 54 during installation. In some implementations, the plastic case may also decrease or prevent residual stress at the printed circuit board or other structure to which the power module is mounted. In this particular implementation, 78 of the pins are usable.

Figure 17:
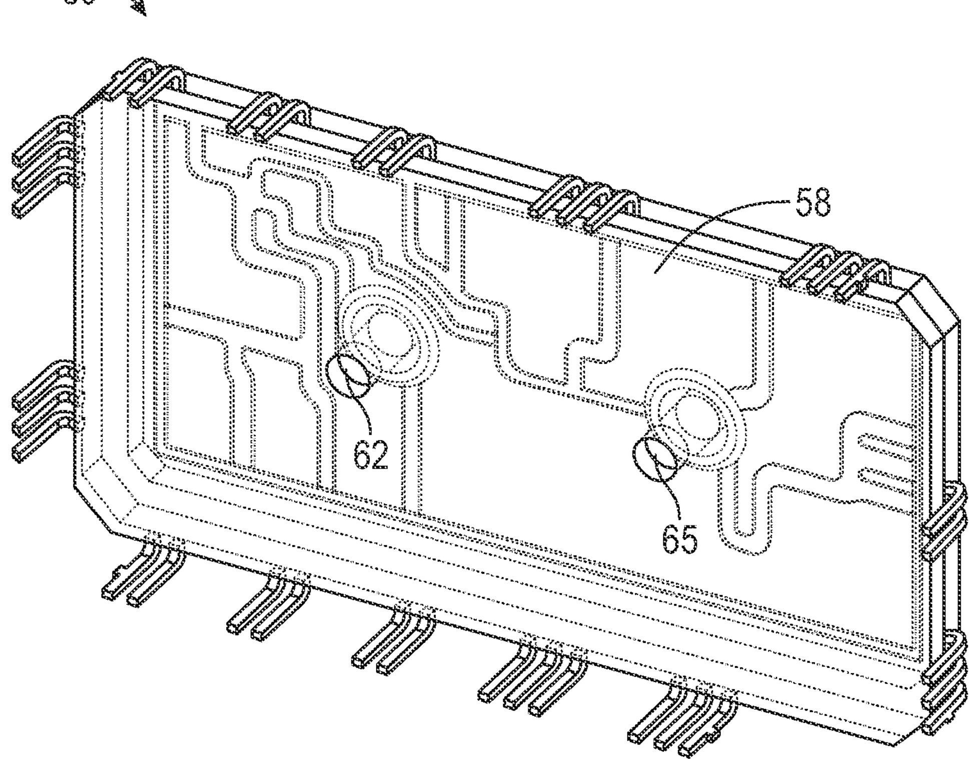
FIG. 17 is a perspective view of a second side of an implementation of a power module having a first mounting hole and a second mounting hole.

Referring to FIG. 17, a second side 58 of an implementation of a power module 60 is illustrated. This implementation includes a first mounting hole and a second mounting hole. The combination of two mounting holes 62 and 65 may facilitate easier installation of the power module for some devices. In various implementations, a plastic case may be used to facilitate installation of the power module. Where multiple mounting holes are used, the plastic case may not include a knob or projection, which may reduce stresses caused by the knob or projection in various implementations. The step width of this module is 3.2 mm. In other implementations, the step width may be 1.5 mm or the step width may be larger depending on the needs of the device.

Power modules may be used in a variety of applications including: embedded computing, accelerator appliances, controllers, processors, network processors, and noise sensitive applications. Other applications include mobile internet devices, tablet computers and other one-cell lithium powered devices. Personal navigation devices and consumer and in-vehicle infotainment devices may also use integrated power modules.

In places where the description above refers to particular implementations of power modules and implementing components, sub-components, methods and sub-methods, it should be readily apparent that a number of modifications may be made without departing from the spirit thereof and that these implementations, implementing components, sub-components, methods and sub-methods may be applied to other power modules.

What is claimed is:

1. A semiconductor package comprising:

a substrate comprising a first side and a second side;

a plurality of leads coupled between the second side of the substrate and a first surface of a molding compound, the molding compound comprised over a portion of five or more surfaces of the substrate;

a first opening extending entirely through the substrate and from the first side of the substrate to an outer edge of the first surface of the molding compound, the first opening configured to receive a coupling device, the coupling device configured to couple with one of a heat sink or a package support; and a stand-off unit directly coupled to the first surface of the molding compound;

wherein the second side of the substrate faces towards the first surface of the molding compound; and wherein the stand-off unit is configured to directly couple to and support the package against the one of the heat sink or the package support.

2. The package of claim 1, wherein the stand-off unit is positioned around the first opening and is directly coupled over the substrate.

3. The package of claim 1, further comprising a second opening, wherein the first opening and the second opening are evenly spaced within the package.

4. The package of claim 1, wherein an outer edge of the stand-off unit lies within a perimeter of the substrate.

5. The package of claim 1, wherein the plurality of leads are each an equal distance from two or more leads on a side of a lead frame comprising the plurality of leads.

6. The package of claim 1, wherein the stand-off unit is integrally formed with the molding compound.

7. The package of claim 1, wherein an entire sidewall of the first opening is orthogonal to the first side of the substrate.

8. A semiconductor package comprising:

a substrate comprising a first side and a second side;

a plurality of leads coupled between the second side of the substrate and a first surface of a molding compound;

a stand-off unit directly extending from the first surface of the molding compound, wherein a perimeter of the stand-off unit lies entirely within a perimeter of the substrate; and a first opening extending entirely through the semiconductor package to an outer edge of the first surface of the molding compound, the first opening configured to receive a coupling device, the coupling device configured to couple with one of a heat sink or a package support;

wherein the semiconductor package is configured to comprise a gap between the stand-off unit and the coupling device when the coupling device is coupled with one of the heat sink or the package support.

9. The package of claim 8, wherein the stand-off unit is positioned around the first opening on the outer edge of the molding compound, wherein the stand-off unit is configured to directly couple to and support the package against the one of the heat sink or the package support.

10. The package of claim 8, further comprising a second opening, wherein the first opening and the second opening are evenly spaced within the package.

11. The package of claim 10, further comprising a second stand-off unit around the second opening.

12. The package of claim 8, wherein the plurality of leads comprise a 3.81 mm pitch.

13. The package of claim 8, wherein the plurality of leads are each an equal distance from two or more leads on a side of a lead frame comprising the plurality of leads.

14. The package of claim 8, further comprising one or more die mechanically and electrically coupled to the second side of the substrate.

15. A semiconductor package comprising:

a substrate comprising a first side and a second side;

a plurality of leads coupled between the second side of the substrate and a first surface of a molding compound;

a first opening extending entirely through the semiconductor package, the first opening configured to receive a coupling device, the coupling device configured to couple with one of a heat sink or a package support; and a stand-off unit directly coupled over the substrate and extending from the first surface of the molding compound, the first surface of the molding compound parallel to the second side of the substrate;

wherein the stand-off unit is configured to support the package against the one of the heat sink or the package support; and wherein the first opening extends to an outer end of the stand-off unit opposite an inner end of the stand-off unit directly coupled to the substrate.

16. The package of claim 15, wherein the stand-off unit is positioned around the first opening on an outer surface of the molding compound.

17. The package of claim 15, further comprising a second opening, wherein the first opening and the second opening are evenly spaced within the package.

18. The package of claim 15, wherein the stand-off unit is configured to directly couple to one of the heat sink or the package support.

19. The package of claim 15, wherein the plurality of leads are each an equal distance from two or more leads on a side of a lead frame comprising the plurality of leads.

20. The package of claim 15, further comprising one or more die mechanically and electrically coupled to the second side of the substrate.

* * * * *